United States Patent [19]

Frazee, Jr. et al.

[11] 4,176,961
[45] Dec. 4, 1979

[54] METHODS AND APPARATUS FOR IMPROVING THE RESOLUTION OF MEASURED PARAMETERS

[75] Inventors: Ralph E. Frazee, Jr., Spotswood Borough; David H. Smithgall, Sr., East Windsor Township, Mercer County, both of N.J.

[73] Assignee: Western Electric Co., Inc., New York, N.Y.

[21] Appl. No.: 836,809

[22] Filed: Sep. 26, 1977

[51] Int. Cl.² .................. G01B 9/02; H03B 19/00; H03K 5/00
[52] U.S. Cl. .................. 356/355; 328/20; 328/38
[58] Field of Search .................. 328/140, 20, 38; 307/220 R, 225 R; 324/78 D, 78 G, 78 J, 78 R; 356/103, 111, 355; 250/550

[56] References Cited

U.S. PATENT DOCUMENTS

| 3,524,075 | 8/1970 | Matthews et al. | 307/235 |
| 3,965,430 | 6/1976 | Brandt | 328/20 |
| 3,982,816 | 9/1976 | Watkins | 356/103 |

OTHER PUBLICATIONS

Merson; Lawrence N., "Digital Multiplier", RCA Technical Notes, No. 736, Jan. 1968.
MacLeod; K., "A Portable High-Resolution Counter for Low-Frequency Measurements", Hewlett-Packard Journal, vol. 25, No. 3, pp. 10-15, 11/1973.
Breslau, "Frequency Doubler", IBM Technical Disclosure Bulletin, vol. 10, No. 6, 11/1967.

*Primary Examiner*—Conrad J. Clark
*Attorney, Agent, or Firm*—D. J. Kirk

[57] ABSTRACT

The diameter of an optical fiber is continuously measured by directing a laser beam at the fiber to form a light intensity fringe pattern. The pattern is converted to a substantially sinusoidal electrical signal having a period proportional to the fiber diameter. The sinusoidal signal is forwarded to a tapped delay line to form a plurality of delayed replicas thereof having a predetermined delay therebetween. A pulse is generated for each zero crossing of all the sinusoidal signals and the pulses interleaved to form an output train having an interpulse interval proportional to a fraction of the fiber diameter.

11 Claims, 16 Drawing Figures

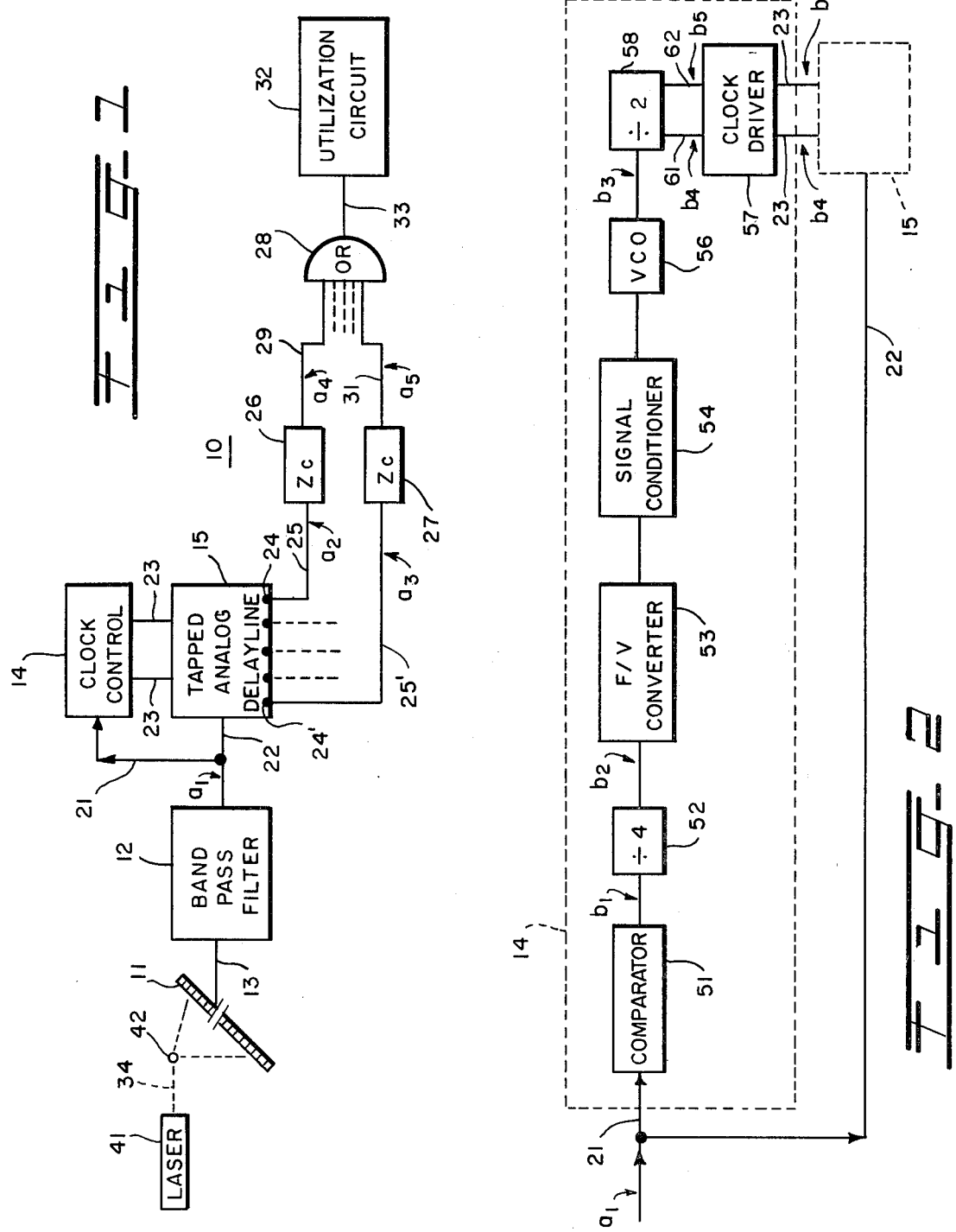

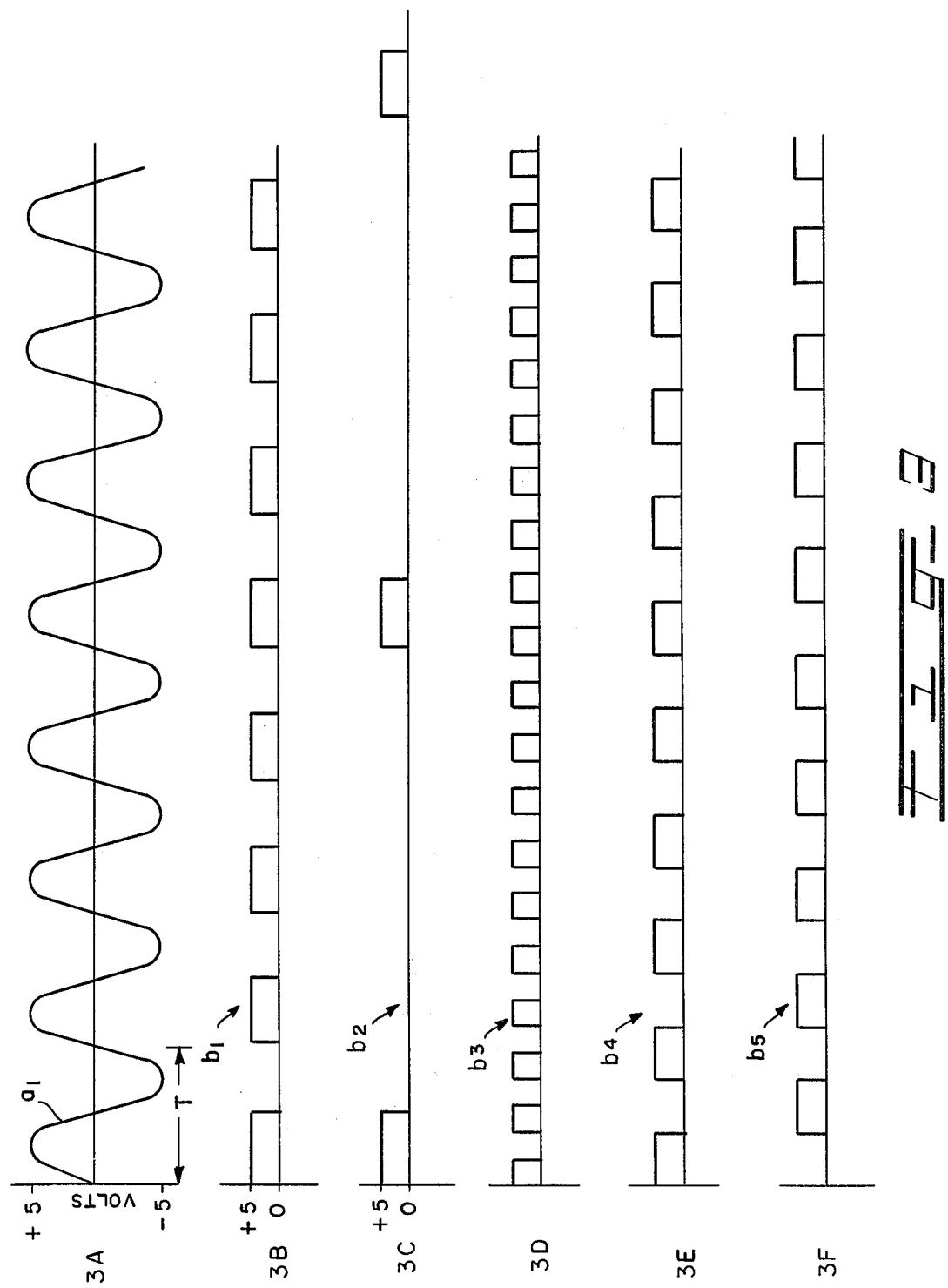

METHODS AND APPARATUS FOR IMPROVING THE RESOLUTION OF MEASURED PARAMETERS

BACKGROUND OF THE INVENTION

1. Field of the Invention

This invention relates to methods and apparatus for obtaining accurate measurements. In particular, the invention is directed to a method for improving the resolution of a measured parameter that is represented by a substantially periodic electrical signal.

2. Description of the Prior Art

It is well known to generate substantially periodic analog electrical signals having a period T which is proportional to a measured parameter. Such a technique has been used to continuously measure parameters such as speed with optical tachometers and to measure the diameter of strand material by directing light from a laser at the strand causing a diffraction fringe pattern to impinge on a light detecting diode array. The diode array is periodically scanned resulting in a continuous, substantially sinusoidal output signal having a period, T, which is proportional to the strand diameter, such a method is limited to counting signal peaks resulting in a signal resolution of T. As a result of such limited resolution, when the parameter being measured changes, causing changes in the detected frequency, such a scheme cannot sense, very quickly, incremental changes in the measured parameter.

One method of providing higher resolution and a more sensitive indication of changes in the measured parameter is to double the detected frequency. U.S. Pat. No. 3,965,430 to Brandt which issued on June 22, 1976 describes a system for digitizing a signal from an optical tachometer which doubles the frequency of the sinusoidal input signal by forwarding a square wave representation of the original sinusoidal signal to a pair of pulse generators connected in parallel and which are arranged to trigger on opposite polarity slopes of the square wave signal. Outputs from each generator are forwarded to an "OR" gate resulting in a pulsating output frequency that is double that of the original input signal. The resolution of such a scheme is T/2.

Such a method clearly improves the resolution but the resolving capability is limited to double the input frequency or twice the resolution. Thus, when resolution greater than a factor of two is required, a different type of system is needed in order to provide the higher resolving capability in addition to more sensitive indication of incremental parameter changes.

Accordingly, there exists a need for a system which converts substantially periodic signals into measured parameters and has an improved resolution which can provide a more sensitive indication of incremental changes in the parameter being measured.

BRIEF SUMMARY OF THE INVENTION

The instant invention overcomes the foregoing problems with a method of improving the resolution of a measuring system in which the period, T, of a substantially periodic electrical signal is proportional to a measured parameter. The method comprises the steps of forming more than two replicas of the periodic electrical signal having a predetermined delay therebetween and generating a pulse at selected corresponding points of all of the replicas of the periodic electrical signal to form a pulse train for each replica. The pulse trains are then interleaved to form a single output pulse train having an interpulse interval that is a fraction of the period T.

Additionally, the delay between the periodic signal replicas is accurately maintained during changes in the periodic signal by a clock control circuit which also receives the periodic signal and provides timing pulses to a signal delay means which forms the replicated signals.

Advantageously, additional delayed replicas of the substantially periodic signal may be generated to further improve the resolution of the measuring system.

Furthermore, the instant method provides a faster indication of any changes that occur in the parameter being measured.

BRIEF DESCRIPTION OF THE DRAWINGS

FIG. 1 is a block diagram of the instant measuring system;

FIG. 2 is a detailed block diagram of the clock control circuit shown in FIG. 1;

FIGS. 3A and 3F are a series of curves representing the signals as they pass through different portions of the clock control circuit;

DETAILED DESCRIPTION OF THE PREFERRED EMBODIMENT

Figure 4:
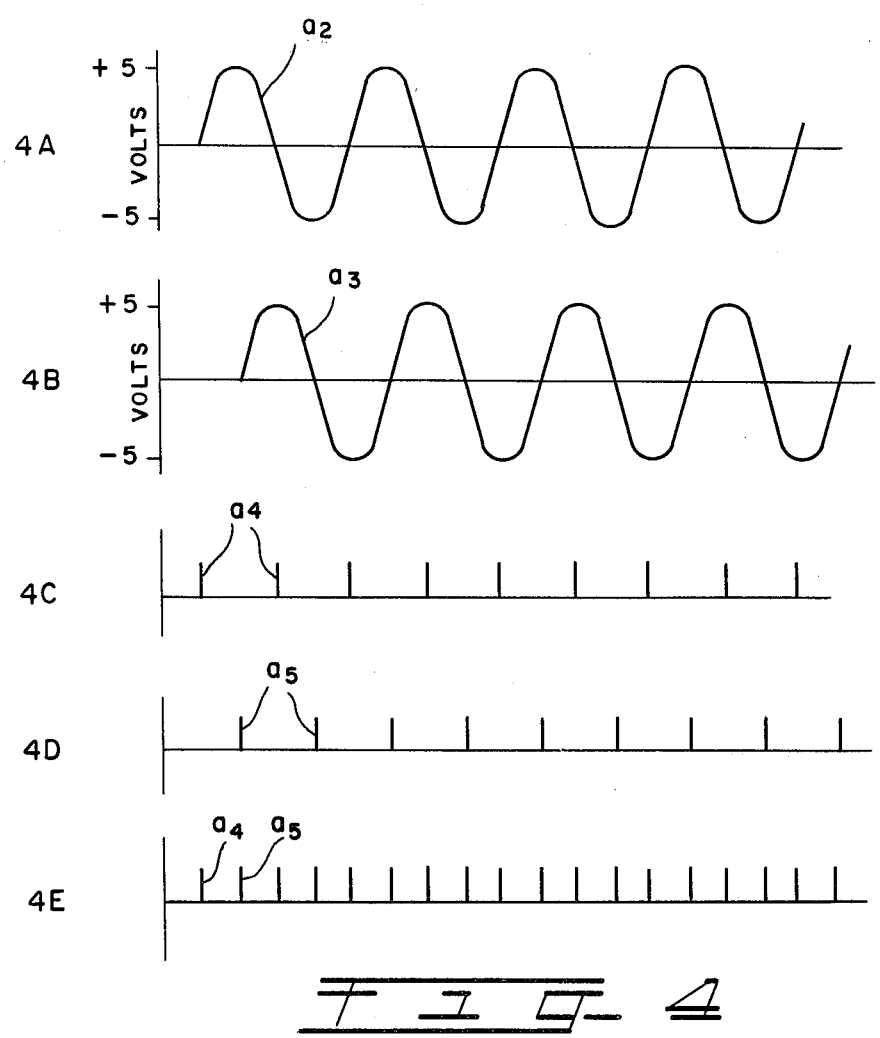
FIGS. 4A to 4E are a series of curves representing signals as they pass through the measuring system.

The preferred embodiment of the instant measuring system will be described as it relates to the measurement of the diameter of optical fibers. However, such disclosure is for purposes of exposition and not for limitation, for the instant system may be used to improve the resolution of any measured parameter wherein the period of a substantially periodic electrical signal represents a measured quantity (e.g., speed, thickness, etc.). Additionally, the periodic signal described in the preferred embodiment is substantially sinusoidal but should not be so limited. Any periodic electrical signal such as a saw tooth, triangular, rectangular wave, or the like, clearly fall within those signals contemplated for use in conjunction with the instant invention.

FIG. 1 is a block diagram of the instant measuring system, generally designated by the numeral 10. A detector 11, which may be a scanned diode array, as shown in FIG. 29 of U.S. Pat. No. 3,982,816 which issued on Sept. 28, 1976 to L. S. Watkins and is assigned to the instant assignee, is connected to a band pass filter 12 over a lead 13. The output of the band pass filter 12 is connected to a clock control circuit 14 and a tapped analog delay line (TAD) 15 over leads 21 and 22, respectively, and the clock control circuit is connected to the TAD over paths 23—23. The TAD 15 has a plurality of output tags 24—24. For purposes of clarity, only two taps 24 and 24' are indicated as being connected; however, additional taps may advantageously be used as will become obvious. The taps 24 and 24' are individually connected via leads 25 and 25' to first and second zero-crossing detectors 26 and 27, respectively. The outputs of the detectors 26 and 27 are connected to two of the inputs of an "OR" gate 28 over leads 29 and 31, respectively. The output of the "OR" gate 28 is forwarded to a utilization circuit 32 over a lead 33.

In the operation of an examplary embodiment, a monochromatic, coherent laser beam 34 from a laser source 41, such as a continuous wave, Helium-Neon laser, is radially directed at an optical fiber 42 to generate a scattered light intensity pattern as disclosed in the aforementioned Watkins patent. The scattered light falls on the detector 11 which generates a time varying signal representative of the scattered light intensity fringe pattern. This signal is then passed over the lead 13 and through the band pass filter 12, having a pass band between 86 KHz and 180 KHz, to remove any d.c. bias or other modulation resulting from the transmission of the beam 34 through the optical fiber 42. The output of the band pass filter 12 will be substantially a sinusoidal signal $a_1$ which is an electrical representation of the light intensity fringe pattern impinging on the detector 11. The signal $a_1$ is shown in FIG. 3A, and has a period T which is inversely proportional to the diameter of the fiber 42.

The sinusoidal signal $a_1$ is fed into the TAD 15, which may be a TAD-32 manufactured by the Reticon Corporation. Output signals $a_2$ and $a_3$ at the taps 24 and 24', respectively, will be replicas of the substantially sinusoidal signal $a_1$ but 90° out of phase (see FIGS. 4A and 4B). The zero-crossing detectors 26 and 27 receive the out-of-phase signals $a_2$ and $a_3$ from the TAD 15 and each generate 100 nanosecond positive-going pulses $a_4$ and $a_5$, respectively, at each zero crossing (see FIGS. 4C and 4D). The zero crossing detectors 26 and 27 may be one of any of those which are commercially available, such as model number LM311 from the National Semiconductor Company. The positive-going pulses from both of the zero-crossing detectors 26 and 27 are forwarded to the "OR" gate 28 resulting in the interleaved output shown in FIG. 4E having an interpulse interval that is a fraction of the period T. The interleaved output is forwarded to a utilization circuit 32 which may be a counting circuit to count the number of interleaved pulses during incremental time periods to determine the diameter of the fiber 42. Such diameter information may be displayed and/or recorded by the utilization circuit 32 and also may be fed back to the fiber drawing system (not shown) to control various parameters of that system (e.g., drawing speed, power, etc.) to accurately adjust the diameter of the drawn fiber 42.

The above-described arrangement clearly doubles the number of zero crossings and by so doing, the period T of the sinusoidal signal 46 which is proportional to the fiber diameter can be resolved to T/4. It should also be clear that connecting additional leads 25—25 to the output taps 24—24 of the TAD 15 to additional zero-crossing detectors, the resolution can be further improved. When such additional delayed replicas are used, it should be clear that the phase between the signals should also be adjusted by connecting to the appropriate taps 24—24. For instance, with three delayed replicas of the sinusoidal signal, the signals should be 60° out of phase; four signals should be 45° out of phase, etc.

The instant measuring system 10, as previously described, can operate accurately when there is no substantial change in the frequency of the sinusoidal signal $a_1$, with the TAD 15 driven by any well known clock arrangement having the desired frequency output. However, in the drawing of the optical fiber 42, changes to the fiber diameter may take place which can substantially alter the scattering pattern resulting in a change of frequency of the sinusoidal signal. Such frequency changes may cause the TAD 15 to output delayed versions of the signal which are not out of phase by the predetermined amount. Accordingly, applicants provide the clock control circuit 14 (see FIG. 1) to receive the sinusoidal signal $a_1$ and forward a clock control signal to the TAD 15 to accurately maintain the clock control frequency at an integral multiple of the sinusoidal signal $a_1$.

The clock control circuit 14 is shown in detail in FIG. 2. The substantially sinusoidal signal $a_1$ from the band pass filter 12 is passed to a comparator 51, through a first divider circuit 52 and then to a frequency-to-voltage converter 53. The output from the converter 53 passes through a signal conditioner 54 and a voltage controlled oscillator (VCO) 56 and forwarded to a clock driver 56 via a second divider circuit 58. The output of the clock driver 57 is connected to the TAD 15.

In operation, the substantially sinusoidal signal (see FIG. 3A) $a_1$ is input to the comparator 51 which acts as a zero-crossing detector. The output of the comparator 51 (e.g., National LM311) switches between 0 and $V_{cc}$, where $V_{cc}$ is the logic supply voltage to generate a pulse train $b_1$, as shown in FIG. 3B. The pulse train $b_1$ is forwarded to the first divider circuit 52 to generate an output train of pulses $b_2$ shown in FIG. 3C that is one-fourth the frequency of the pulse train $b_1$. The first divider circuit 52 may be one of many well known commericial divider circuits; in applicants' exemplary embodiment, the divider circuit is comprised of two D-type of J+K type flip flops connected in tandem.

The frequency-to-voltage converter 53, which may be an Itech A8400 or a Teledyne Philbrick 4704, or equivalents receives the pulse train $b_2$ from the first divider circuit 52 and generates an analog d.c. output voltage proportional to the frequency of the input pulse train. The frequency range input to the frequency-to-voltage converter 53 is 0 to 100 KHz and the output range is 0 to 10 volts.

The analog d.c. voltage output from the converter 53 is presented to the signal conditioner circuit 54 for purposes of filtering, amplifying and biasing. The most important function of the signal conditioner circuit being that of filtering which is required due to spurious signals or spikes superimposed on the sinusoidal signal during the conversion of the light intensity pattern to sinusoidal signal.

Figure 5:
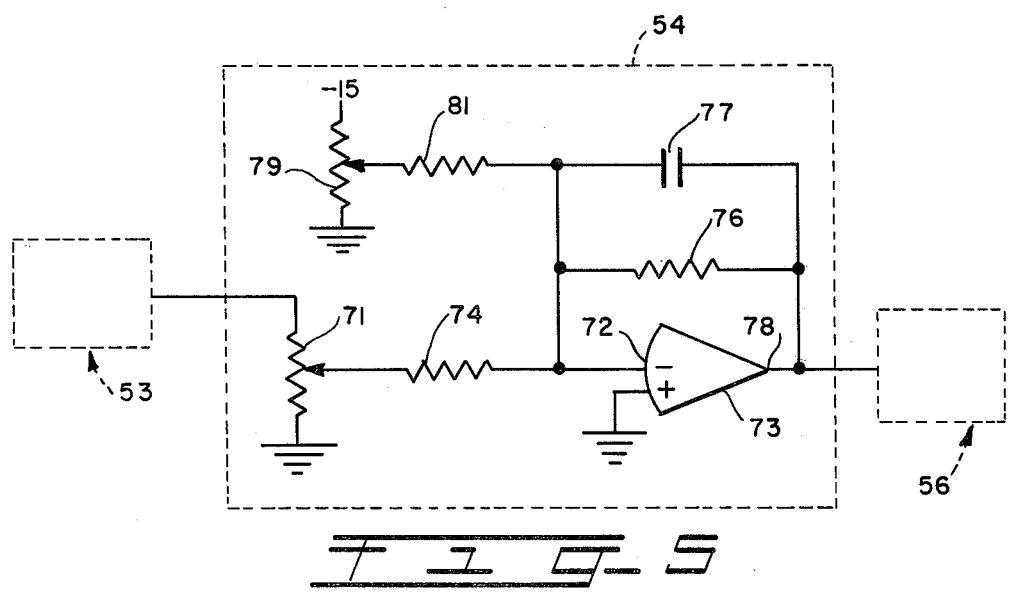
FIG. 5 is a circuit diagram of a signal conditioner circuit.

The signal conditioner circuit is shown in detail in FIG. 5. The d.c. voltage input is attenuated by a first potentiometer 71 which is further connected to a negative input 72 of an operational amplifier 73 (e.g., MC 1458) via a resistor 74. A resistor 76 and a capacitor 77 are connected in parallel across the operational amplifier 73 from the terminal 72 to an output terminal 78. The terminal 72 is also connected to a second potentiometer 79 via a resistor 81.

In operation the d.c. input signal from the frequency-to-voltage converter 53 is attenuated by the first potentiometer 71 and biased by the second potentiometer 79. The filtering function is accomplished by the parallel combination of the resistor 76 and the capacitor 77. The d.c. signal from output 78 is forwarded to the VCO 56.

The VCO 56 (e.g., Motorola MC4024) converts an analog input signal (0 to +5 volts) to a pulse train output $b_3$ as shown in FIG. 3D. The frequency of the pulse train of FIG. 3D is determined by the response characteristics of the VCO 56. The second divider circuit 58 divides the pulse frequency output of the VCO 56 by two and provides two outputs, $b_4$ and $b_5$, on leads 61 and 62, respectively, which outputs are shown in FIGS. 3E and 3F. The divider circuit 58 is a "D" type flip flop with both the Q and $\bar{Q}$ outputs used to provide complementary pulse trains with a 50 percent duty cycle. The clock driver circuit 57 forwards the pulse trains $b_4$ and $b_5$ to the TAD 15. The clock driven circuit 57 minimizes the switching noise of the pulse trains $b_4$ and $b_5$ from the divider circuit 58 (Reticon Corporation MMH0026) and provides maximum performance at high scan rates.

The purpose of the clock control circuit 14 is to maintain a predetermined relationship between the frequency of the pulse trains $b_4$ and $b_5$ and the frequency of the sinusoidal signal $a_1$. In a particular working embodiment of the instant measuring system 10 the substantially sinusoidal signal $a_1$, shown in FIG. 3A has a frequency of 125 KHz when measuring an optical fiber 42 having a diameter of 100 $\mu$m. The pulse train $b_1$, shown in FIG. 3B, also has a frequency of 125 KHz while the pulse train $b_2$, shown in FIG. 3C, has a frequency of 31.25 KHz. The output voltage from the frequency-to-voltage converter 53 is approximately 3.6 volts. For the choice of the taps 24—24 selected on the TAD 15, the frequency of the pulse trains $b_4$ and $b_5$ is 2.5 MHz which is an integral multiple of the frequency of the signal $a_1$. Therefore the output pulse train $b_3$ of the VCO 56 must be 5 MHz corresponding to an input voltage to the VCO of approximately +4.0 volts.

The above-described exemplary embodiment was used to accurately measure optical fibers having diameters between 50 $\mu$m and 250 $\mu$m to a resolution of 0.20 $\mu$m. However, it should be clear to one or ordinary skill in the art to construct measuring systems directed to different ranges of fiber diameters by the appropriate selection of the band pass filter 12 and the parameters of the clock control circuit 14.

Although it has been indicated that at least two replicas of the periodic signal are formed, it should be clear that one of the replicas can be replaced with the periodic signal. The important aspect being that the predetermined delay should be maintained between the periodic signal and any replicas thereof.

What is claimed is:

1. A method of improving the resolution of a measuring system in which the period, T, of a substantially periodic electrical signal is proportional to a measured parameter, the method comprising the steps of:
    (a) forming more than two replicas of the periodic electrical signal having a predetermined delay therebetween;
    (b) generating a pulse at selected corresponding points of all the replicas of the periodic electrical signal to form a pulse train for each replica; and
    (c) interleaving the pulse trains to form a single output pulse train having an interpulse interval that is a fraction of the period T.

2. The method as set forth in claim 1 which is further characterized by accurately maintaining the predetermined delay.

3. The method as set forth in claim 2 wherein the predetermined delay is accurately maintained by:
    generating a pulse train having the same frequency as the substantially periodic electrical signal;
    converting the frequency of the pulse train into a d.c. voltage;
    filtering the d.c. voltage;
    converting the filtered d.c. voltage into a timing pulse train having a frequency which is an integral multiple of the substantially periodic electrical signal; and
    accurately maintaining the delay between the substantially periodic electrical signal replicas under the control of the timing pulse train.

4. The method as set forth in claim 3 wherein the measured parameter is the diameter of an optical fiber and the method is further characterized by, prior to step (a):
    directing a monochromatic, coherent beam of light at the optical fiber to form a scattered light intensity fringe pattern; and
    converting the light intensity fringe pattern into the periodic electrical signal.

5. A method of measuring the diameter of an optical fiber comprising the steps of:
    directing a laser beam at the optical fiber to form a scattered light intensity fringe pattern;
    converting the light intensity fringe pattern into an electrical signal;
    filtering the electrical signal to produce a substantially sinusoidal signal having a period, T, which is proportional to the diameter of the fiber;
    forming more than two replicas of the sinusoidal signal having a predetermined delay therebetween;
    accurately maintaining the predetermined delay;
    passing each replica of the sinusoidal signal to a zero-crossing detector, each detector producing a pulse train representing the zero crossings of the sinusoidal signals;
    interleaving the pulse trains to form a single output pulse train having an interpulse interval that is a fraction of the period T; and
    counting the pulses in the single pulse train over a predetermined period of time to determine the fiber diameter.

6. A measuring system, having improved resolution, in which the period, T, of a substantially periodic electrical signal is proportional to a measured parameter, the system comprising:
    means for forming more than two replicas of the periodic signal having a predetermined delay therebetween;
    means for generating a pulse at selected corresponding points of all versions of the periodic signals to form a pulse train for each replica; and
    means for interleaving said pulse trains to form a single output pulse train having an interpulse interval that is a fraction of the period T.

7. The measuring system as set forth in claim 6, which comprises:
    means for accurately maintaining the delay between the substantially periodic signal replicas.

8. The measuring system as set forth in claim 7 wherein the means for accurately maintaining the delay between the substantially periodic signal replicas comprises:
    a comparator circuit to receive the substantially periodic signal and generate a pulse train having the same frequency;
    a frequency-to-voltage converter to convert the pulse train output from the comparator circuit to a d.c. voltage;
    a signal conditioner circuit to filter the d.c. output from the frequency-to-voltage converter; and
    a voltage controlled oscillator which converts the filtered d.c. voltage to a timing pulse train having a frequency which is an integral multiple of the frequency of the substantially periodic signal.

9. The measuring system as set forth in claim 7 wherein the measured parameter is the diameter of an optical fiber and the substantially periodic electrical signal is formed by:
- means for directing a laser beam at the optical fiber to form a scattered light intensity fringe pattern; and
- means for converting the light intensity pattern into an electrical signal.

10. A measuring system for measuring the diameter of an optical fiber, comprising:
- means for directing a laser beam at the optical fiber to form a scattered light intensity fringe pattern;
- means for converting the light intensity fringe pattern into an electrical signal;
- means for filtering the electrical signal to produce a substantially sinusoidal signal having a period, T, which is proportional to the diameter of the fiber;
- means for forming more than replicas of the sinusoidal signal having a predetermined delay therebetween;
- means for accurately maintaining the predetermined delay;
- means for producing an output pulse train for each replica of the sinusoidal signal, each pulse train representing the zero crossings of the sinusoidal signals; and
- means for interleaving the pulse trains to form a single output pulse train having an interpulse interval that is a fraction of the period T.

11. A method of measuring the period of a substantially periodic electrical signal, which comprises the steps of:
- (a) forming at least two delayed replicas of the signal;
- (b) generating a pulse at selected corresponding points of the periodic electrical signal and each delayed replica thereof to form a series of markers;
- (c) interleaving the markers to form a single pulse train; and
- (d) determining, from the number of markers appearing in said single pulse train during a predetermined period of time, the period of the signal.

* * * * *

UNITED STATES PATENT OFFICE
CERTIFICATE OF CORRECTION

PATENT NO. : 4,176,961
DATED : December 4, 1979
INVENTOR(S) : RALPH E. FRAZEE, JR., DAVID H. SMITHGALL, SR.

It is certified that error appears in the above—identified patent and that said Letters Patent are hereby corrected as shown below:

In the specification, Column 1, line 50, "to more" should read --to a more--. Column 2, line 22, "3A and 3F" should read --3A to 3F--; line 59, "tags" should read --taps--. Column 3, line 1, "examplary" should read --exemplary--. Column 4, line 16, "driver 56" should read --driver 57--; line 29, "commericial" should read --commercial--; line 31, "of J+K" should read --or J+K--. Column 5, line 4, "Q and Q" should read --Q and Q̄--; line 32, "one or" should read --one of--. Column 7, claim 10, line 20, "more than replicas" should read --more than two replicas--.

Signed and Sealed this

Twenty-second Day of April 1980

[SEAL]

Attest:

Attesting Officer

SIDNEY A. DIAMOND

*Commissioner of Patents and Trademarks*